(12) United States Patent
Iksan et al.

(10) Patent No.: US 7,339,278 B2
(45) Date of Patent: Mar. 4, 2008

(54) CAVITY CHIP PACKAGE

(75) Inventors: Henry Iksan, Tsuen Wan (HK); Seong Kwang Brandon Kim, Singapore (SG); Susanto Tanary, Singapore (SG); Hien Boon Tan, Singapore (SG); Yi Sheng Anthony Sun, Singapore (SG)

(73) Assignee: United Test and Assembly Center Ltd., Singapore (SG)

( * ) Notice: Subject to any disclaimer, the term of this patent is extended or adjusted under 35 U.S.C. 154(b) by 0 days.

(21) Appl. No.: 11/536,635

(22) Filed: Sep. 28, 2006

(65) Prior Publication Data

US 2007/0069371 A1    Mar. 29, 2007

Related U.S. Application Data

(60) Provisional application No. 60/721,576, filed on Sep. 29, 2005.

(51) Int. Cl.
*H01L 23/48* (2006.01)
*H01L 23/52* (2006.01)
*H11L 29/40* (2006.01)

(52) U.S. Cl. .............. 257/778; 257/686; 438/108; 438/107

(58) Field of Classification Search ............ 257/686, 257/777, 778; 438/108, 109, 107, 110
See application file for complete search history.

(56) References Cited

U.S. PATENT DOCUMENTS

| | | | |
|---|---|---|---|
| 6,469,376 B2 * | 10/2002 | Vaiyapuri | 257/686 |
| 6,659,512 B1 * | 12/2003 | Harper et al. | 257/777 |
| 6,674,159 B1 * | 1/2004 | Peterson et al. | 257/680 |
| 2005/0285254 A1 * | 12/2005 | Buot et al. | 257/700 |

* cited by examiner

*Primary Examiner*—S. V. Clark
(74) *Attorney, Agent, or Firm*—Horizon IP Pte. Ltd.

(57) ABSTRACT

A package for an IC includes a carrier with a cavity formed on one of the major surfaces. Bumps of a semiconductor die are mated to contact pads located on the bottom of the cavity. The die is attached to the major surface of the carrier. The major surface creates a support which securely holds the chip in place with adhesive for assembly.

23 Claims, 18 Drawing Sheets

CAVITY CHIP PACKAGE

FIELD OF THE INVENTION

The present invention relates generally to integrated circuits (ICs) and, more particularly, to IC packaging.

BACKGROUND OF THE INVENTION

The fabrication of ICs involves the formation of features on a substrate that make up circuit components, such as transistors, resistors and capacitors. The devices are interconnected, enabling the ICs to perform the desired functions. Numerous ICs are fabricated in parallel on a wafer. After wafer processing is completed, the wafer is diced, separating the ICs into individual chips. The individual chips are, for example, assembled in a package.

FIG. 1 shows a conventional electronic chip package 100. The package includes a package substrate 110 and an IC chip 150 which includes chip conductive bumps 155 on an active surface 151. The conductive bumps, for example, are formed from solder balls. Such type of chips is referred to as a flip chip. The chip is mounted on a chip mount (or upper) surface 113 of the substrate, with the bumps contacting contact pads thereon. An underfill 161 is provided, filling the space between the chip and substrate. A lower surface 114 of the substrate includes package conductive balls 103 which form a ball grid array (BGA). Upper and lower conductive traces are provided on respective upper and lower surfaces and interconnected by vias 107 in the substrate, facilitating electrical connections between the package conductive balls and chip conductive bumps.

The present invention provides a package which satisfies demands of increased input-output (I/O) densities and operating frequencies with enhanced thermal and electrical performance.

SUMMARY OF THE INVENTION

The present invention relates generally to packages for ICs. The package can be used for various types of ICs, such as memory or logic devices. In one aspect of the invention, the package comprises a carrier having first and second major surfaces. A cavity is provided on the first major surface of the carrier. The cavity includes a cavity bottom surface with contact pads disposed thereon and sidewalls surrounding the cavity bottom surface. When a chip is attached to the carrier, conductive bumps on an active surface of the chip are mated to contact pads located on the bottom surface of the cavity while the chip is attached to the first major surface of the carrier. Package contacts are disposed on one of the major surfaces and are electrically coupled to the contact pads.

In another aspect, the invention relates to a method of packaging an IC. The method comprises providing a carrier having a cavity formed on a first major surface thereof. A semiconductor die with an active surface having conductive bumps is attached to the first major surface of the carrier. When attached, the conductive bumps are mated to contact pads located on a bottom surface of the cavity and periphery of the active surface is securely attached to the carrier surface by an adhesive material.

In various aspects of the invention, the cavity includes first and second sub-cavities. The sub-cavities, for example, are formed by at least partially concentric openings. When the chip is mounted to the carrier, the conductive bumps are mated to the contact pads on the bottom surface of the first sub-cavity while the chip is attached to a bottom surface of the second sub-cavity. The depth of the second sub-cavity can be equal to or greater than the thickness of the chip which causes a top surface of the chip to be at or below the first major surface. Alternatively, the depth of the second sub-cavity can be less than the thickness of the chip which causes the top surface of the chip to be above the first major surface of the carrier.

The package can further be adapted for multi-chip applications. In one embodiment, a second chip is attached to the first major surface above the second sub-cavity. Other multi-chip arrangements can include for example, one or more cavities on one or both major surfaces of the carrier. Additional sub-cavities can be provided to mount additional chips to the package. Multi-chip packages can be used in System-in-Package (SiP) applications. Alternatively, multiple packages can be stacked for Package-on-Package applications. The various packages can be used for high frequency applications having high pin counts and a small form factor. In addition, the packages provide improved thermal conductivity and electrical performance.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION OF THE INVENTION

Figure 1:
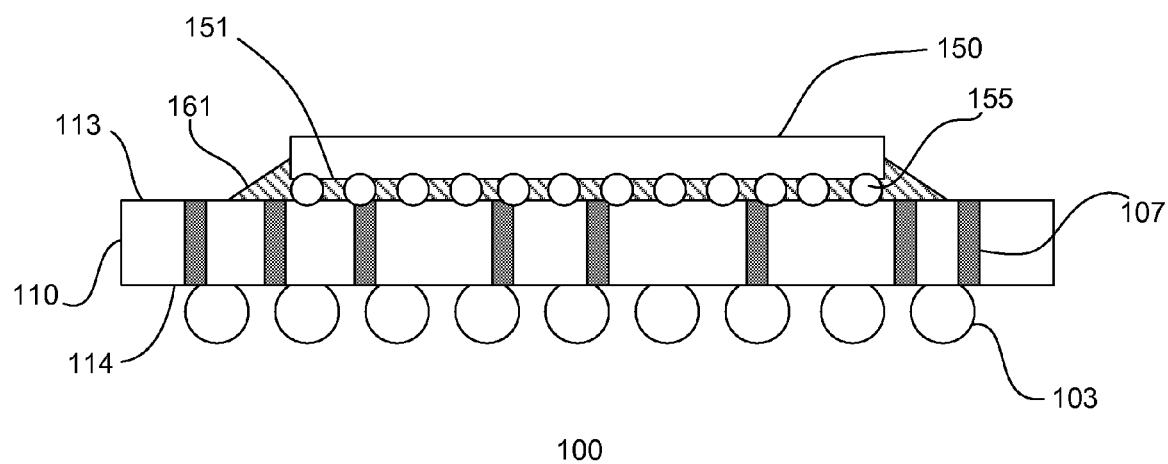
FIG. 1 shows a conventional chip package.
Figure 2A:
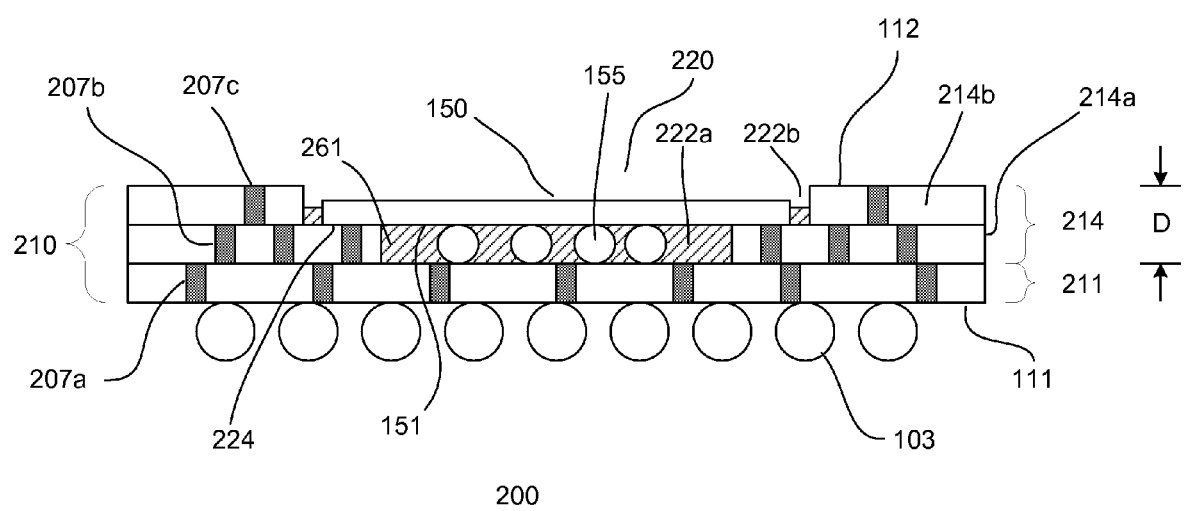
FIGS. 2a-b show a chip package in accordance with one embodiment of the invention.
Figure 2B:
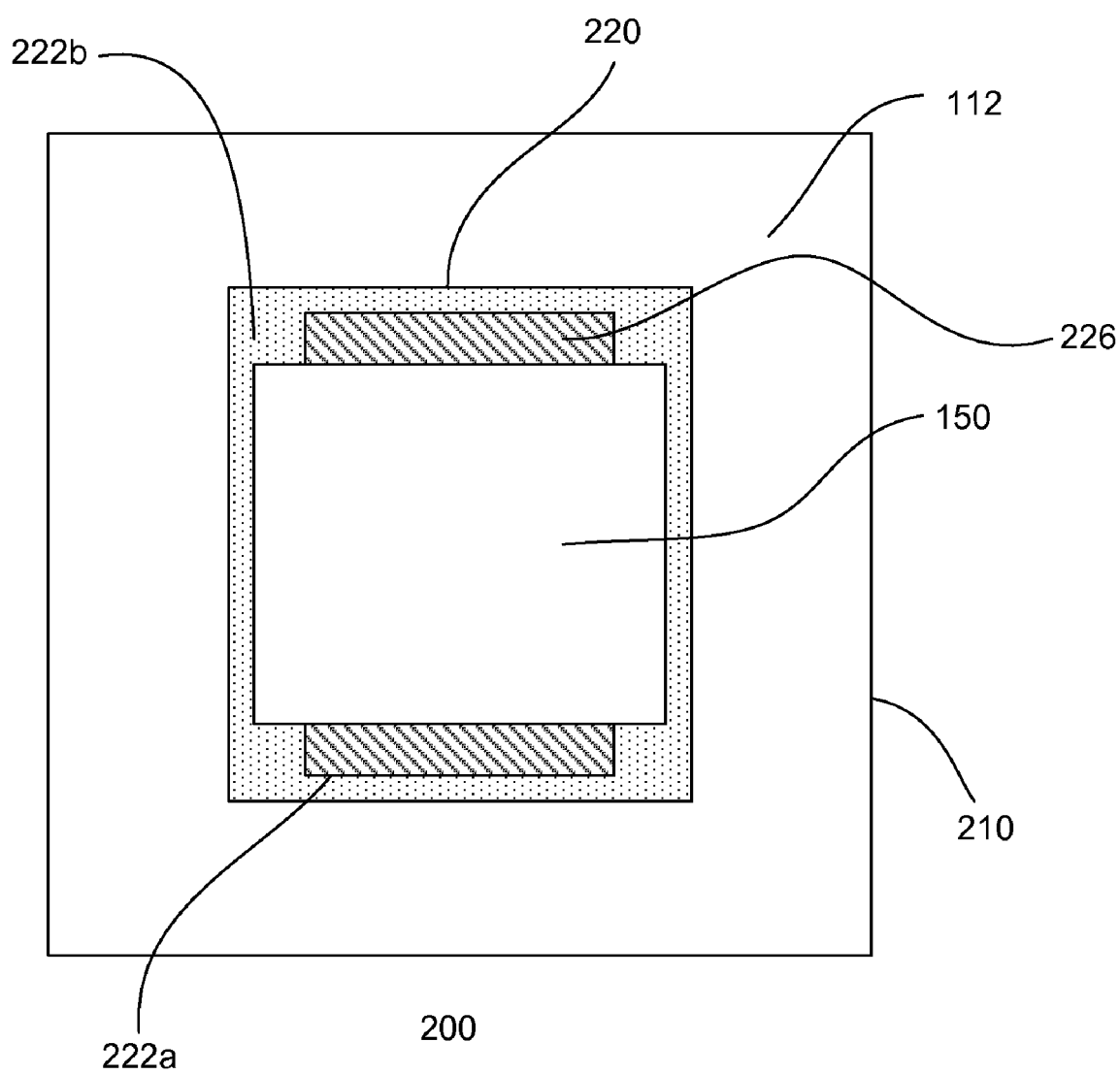

FIGS. 2a-b show cross-sectional and top views of a chip package 200 in accordance with one embodiment of the invention. The chip package includes a carrier or package substrate 210 with bottom and top major surfaces 111 and 112. Typically, the carrier comprises a rectangular shape to form a rectangular shaped device. Package contacts are disposed on one of the major surfaces. The surface on which the contacts are located is, for example, referred to as the bottom surface. The package contacts can comprise spherical shaped structures or balls arranged in a grid pattern to form a BGA. The balls, for example, comprise solder. Various types of solders can be used, such as lead-based, non lead-based alloys or conductive polymers. Arranging the contacts in other patterns or providing other types of contacts are also useful.

A semiconductor die or chip 150 is mounted on the substrate. The chip can be any type of IC. For example, the IC can be a memory device such as a dynamic random access memory (DRAM), a static random access memory (SRAM) and various types of non-volatile memories including programmable read-only memories (PROM) and flash memories, an optoelectronic device, a logic device, a communication device, a digital signal processor (DSP), a microcontroller, a system-on-chip, as well as other types of devices.

In one embodiment, the chip is in the form of a flip chip. A flip chip includes an active surface 151 on which conductive bumps 155 are formed. The conductive bumps, for example, comprise solder bumps. Various types of solders, such as lead-based, non lead-based alloys or conductive polymers, can be used to form the conductive bumps. Chip contact pads (not shown) are disposed on the surface of the substrate. The contact pads are connected to the package contacts by conductive traces. When the chip is mounted onto the carrier, the bumps are mated to the pads. Solder paste can be provided on the pads. The solder paste melts during assembly, forming a connection between the pads and conductive bumps of the chip.

To secure the chip for assembly, various techniques can be employed. For example, the chip can be secured using tape, such as adhesive or conductive tape. An underfill 261, such as epoxy, can be provided in the cavity to encapsulate and protect the conductive bumps. The underfill serves to reduce thermal stress between the bumps and contact pads, improving reliability. The underfill should at least fill the space between the chip and the carrier, completely encasing the bumps. In one embodiment, the underfill fills the cavity. Various techniques can be used to provide the underfill in the cavity. The underfill, for example, can be needle-dispensed along the edges of the chip and drawn into the space between the chip and carrier by capillary action and cured to form a permanent bond. Alternatively, moldable underfill can be used. Moldable underfill is described in, for example, U.S. Pat. No. 7,005,320, which is herein incorporated by reference for all purposes. Other techniques for applying the underfill can also be useful.

A cavity 220 is provided on the carrier. In one embodiment, the cavity is formed on the major surface which does not contain package contacts 103. Forming the cavity on the same surface as the package contacts is also useful. In such case, the package contacts can be disposed on the carrier surface surrounding the cavity. In one embodiment, the cavity comprises first and second sub-cavities 222a-b. The sub-cavities are concentric or partially concentric openings, with the smaller (first sub-cavity) below the larger (second sub-cavity) opening. The openings form a stepped sidewall profile which delineates the sub-cavities. Preferably, the sidewalls of the sub-cavities are vertical or substantially vertical. The bottom of the first sub-cavity includes chip contact pads while the top of the second sub-cavity is coplanar with the major carrier surface.

The dimensions of the sub-cavities should be sufficient to accommodate the IC chip. The cavity can be designed to accommodate a specific type of IC chip or various sized chips to form a generic package. Generic packages offer more flexibility but may increase the package size. The cavity, for example, comprises a rectangular shape. Generally, the cavity comprises a shape corresponding to the shape of the chip. Other shapes can also be useful.

In one embodiment, the flip chip is disposed in the cavity. The conductive bumps on the chip are mated to the contact pads, and the periphery of the chip is attached to the bottom of the second sub-cavity. In one embodiment, opposing ends 224 of the flip chip are attached to the bottom of the second sub-cavity. Attaching the flip chip to all, some, or portions of sides, or a combination thereof is also useful. Tape or adhesive is disposed on the bottom of the second sub-cavity (and or bottom surface of the chip contacting the bottom of the second sub-cavity) to secure the chip. The surface created by the bottom of the second sub-cavity serves as a support which holds the chip securely in place during assembly. Providing a support surface for securing the chip advantageously facilitates assembly of various types of flip chips. For example, flip chips with solder bumps not configured for direct surface mounting, such as chips with single rows of bumps, can be mounted. Furthermore, by being able to hold the chip securely in place during assembly, yield and reliability is improved.

A gap 226 exists between the cavity sidewall and chip. The gap should be sufficient to allow underfill to flow into the cavity to fill the space between the chip and bottom of the cavity. For example, the gap is about 0.005 to 0.010 inches. Other gap dimensions may also be useful. The gap dimension may, for example, depend on the type of underfilling, such as capillary or moldable underfilling. In one embodiment, the gap should be sufficient to accommodate the different types of underfilling. As shown, gaps are provided on opposite sides which do not contact the chip. The gaps, in one embodiment, are along the length of the sides of the cavity. Other gap configurations are also useful. For example, the cavity may include a gap on one side, gap or gaps on a portion of a side or sides of the cavity or other gap arrangements.

In one embodiment, the first sub-cavity has a depth which causes contact between the conductive bumps of the chip to contact the pads at the bottom of the cavity as well as the lower surface of the chip and the top of the first sub-cavity (or bottom of the second sub-cavity). As for the second sub-cavity, its depth can be selected to be equal to or greater than the thickness of the chip, encasing the chip within the cavity. The overall depth D of the cavity, in one embodiment, is equal to or greater than the height of the chip (including the conductive bumps). For example, D is about 240 μm for chip height of about 150 μm. Providing a second sub-cavity with a depth less than the thickness of the chip is also useful, causing the upper surface of the chip to be above the upper surface of the carrier. Such configuration facilitates thermal coupling between the chip and, for example, a heat sink disposed on the surface of the carrier. The overall thickness of the package can advantageously be reduced by providing a cavity in which a chip is bonded. Additionally, the cavity also facilitates stacking of chips.

In one embodiment, the carrier comprises a multi-layered laminate substrate including base and supplemental layers 211 and 214. The base layer serves as a substrate on which the chip is attached while the supplemental layer forms the cavity. The base and supplemental layers can be bonded together to form the carrier. Contact pads are disposed on the base layer in the cavity region for electrical coupling with the chip. Conductive traces fan out from the contact pads and are coupled to the package contacts. When the package contacts and contact pads are located on opposite surfaces, vias 207a are used to form electrical connections between the surfaces. The vias may be electrically coupled to the package contacts directly or indirectly through electrical traces on the bottom surface of the carrier. A solder mask comprising an insulating material can be provided on the carrier surfaces, covering the electrical traces and openings corresponding to the package contacts and contact pads. The conductive traces, vias and solder masks can be formed using various conventional techniques, for example, photolithography, etching, plating, and mechanical or laser drilling.

The supplemental layer, in one embodiment, comprises a plurality of layers. For example, the supplemental layer comprises first and second layers 214*a-b* forming first and second sub-cavities. Electrical traces can be disposed on, for example, top surfaces of one or both of the supplemental layers. Disposing electrical traces on the bottom or on both surfaces is also useful. Providing electrical traces on the supplemental layers increases the amount of surface area for traces without increasing the footprint of the package. Furthermore, the base and supplemental layers can include multiple layers or sub-layers, with or without electrical traces on its surfaces. Adjacent electronic traces are isolated by an insulating layer. The electronic traces on the different layers (or sub-layers) can be interconnected as desired using blind, buried or through vias 207*a-c*.

Figure 2C:
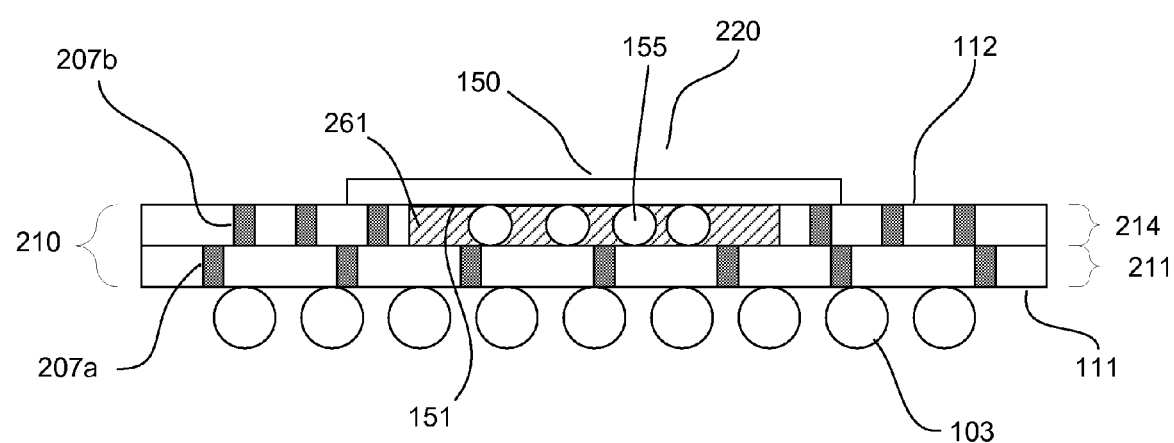
FIG. 2c shows an alternative embodiment of the invention.

In another embodiment, the cavity of the carrier can be provided with continuous sidewalls. This can be achieved by, for example, providing a carrier as described but without the second supplemental layer 214*b*. When attached, the conductive bumps are mated to the base of the cavity while the chip is securely attached to the major surface of the carrier, as shown in FIG. 2*c*.

The chip can also be attached to the carrier using other techniques. For example, the chip can be attached using conventional wire bonding technique. Typically, wire bonding includes mounting the chip on the carrier using an adhesive or tape. Bond pads located on an upper surface of the chip are coupled to contact pads on the carrier by wires. In one embodiment, the chip is attached to the base of the first sub-cavity. Contact pads are located on the base of the second sub-cavity. In the case where the carrier does not include a second sub-cavity, the contact pads would be on the surface of the carrier. Wires connect the bond pads on the chip to contact pads on the carrier. By providing contact pads on the base of the second sub-cavity, the size of the first sub-cavity can be reduced. This enables the over-all package size to be decreased. Alternatively, contact pads can be provided on the base of the first sub-cavity or on base of both sub-cavities to which the chip is wire bonded.

Figure 3A:
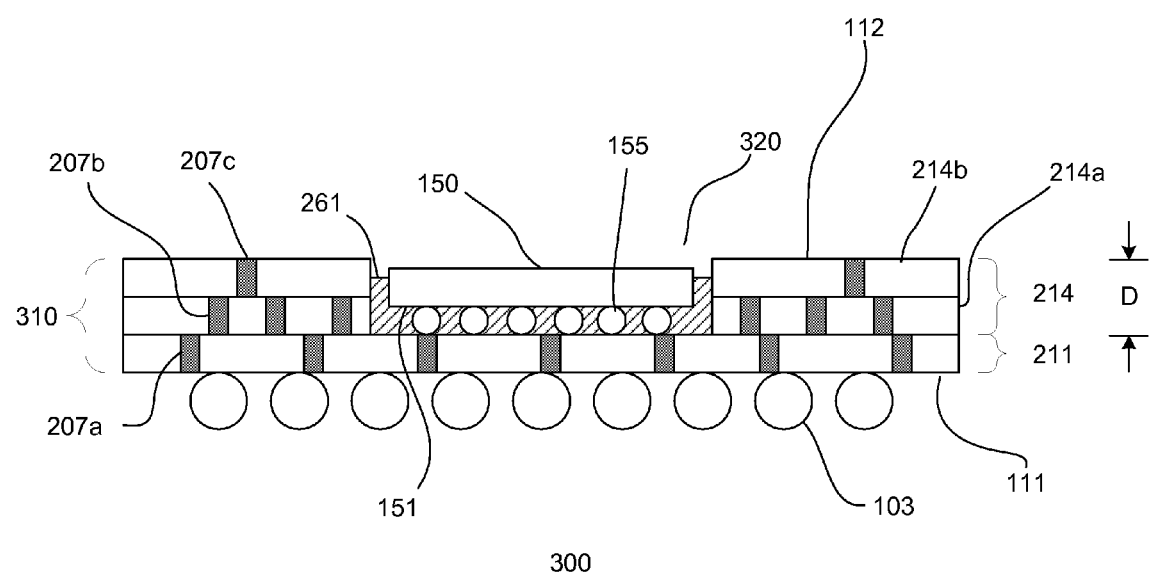
FIGS. 3a-b show a chip package in accordance with another embodiment of the invention.
Figure 3B:
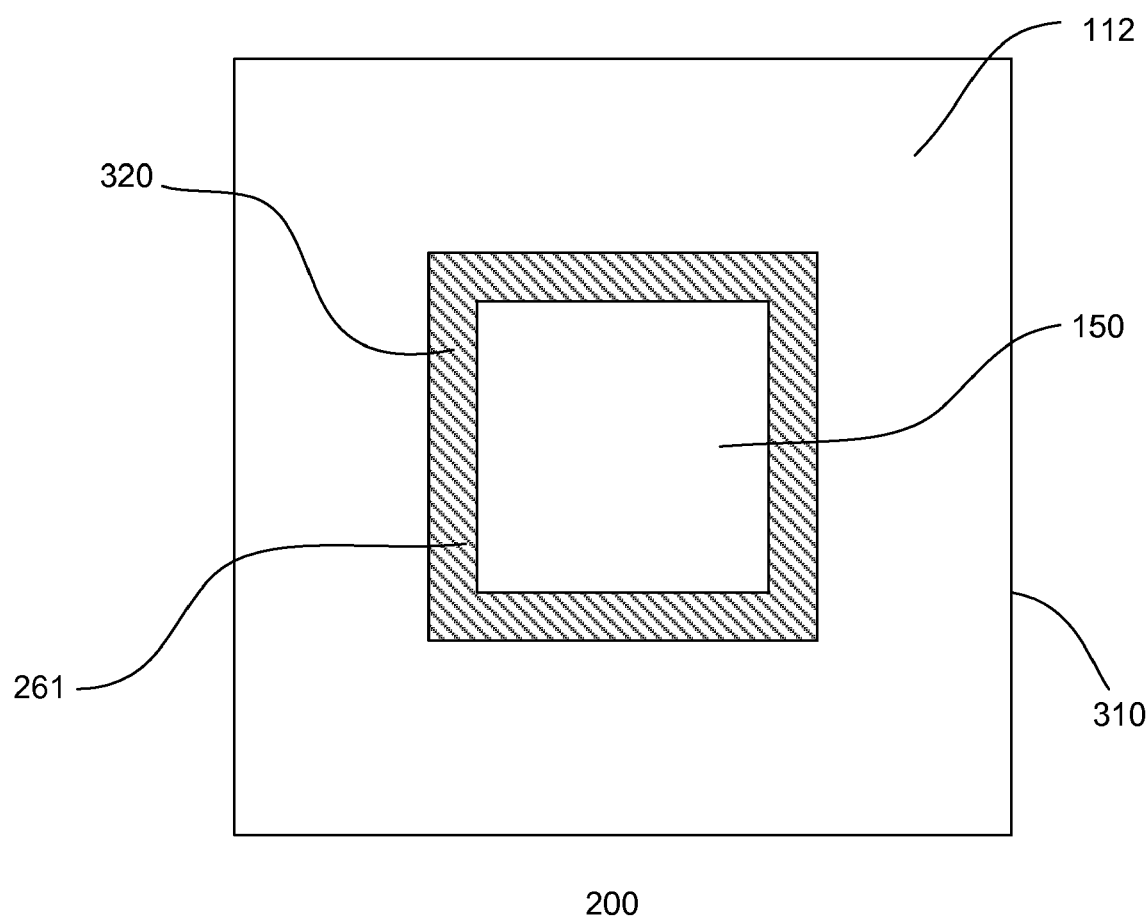

FIGS. 3*a-b* show cross-sectional and top views of a chip package 300 in accordance with another embodiment of the invention. The package contains common or similar elements to those contained in package 200 of FIGS. 2*a-b*. Whenever common or similar elements are contained in the various embodiments described herein, they are designated with the same reference number. Common elements, once they have been described, may not necessarily be described again or described in detail.

The package includes a carrier 310 having first and second major surfaces 111 and 112. Package contacts 103 are provided on one of the surfaces of the carrier. A cavity 320 is formed on the same surface or on different surface as the package contacts. As shown, the cavity is formed on the major surface opposite that of the package contacts. In accordance with one embodiment, the cavity comprises continuous sidewalls from the top to the bottom of the cavity. Preferably, the cavity sidewalls are vertical or substantially vertical.

The carrier can comprise a multi-layered laminate substrate including base and supplemental layers 211 and 214. The base layer serves as a substrate on which the chip is attached while the supplemental layer forms the cavity. The base and supplemental layers can be bonded together to form the carrier. The base and/or supplemental layers can include multiple layers with electronic traces on one or both surfaces. Contact pads are disposed on the base layer in the cavity region for electrical coupling with the chip. Conductive traces fan out from the contact pads for coupling with the package contacts by, for example, blind, through or buried vias 207*a-c*.

In one embodiment, a flip chip 150 is placed in the cavity. The conductive bumps 155 of the flip chip are connected to the contact pads. To secure the chip in place, adhesive bumps and/or conductive tape can be used. The chip can also be secured in place using various other techniques. Preferably, the depth D of the cavity should be equal to or greater than the height of the chip (including the conductive bumps), encasing the chip therein. Other values of D may also be useful. The chip can also be attached to the carrier using other techniques, such as wire bonding.

A gap is provided to enable the underfill to flow into the cavity and fill the space between the chip and carrier. The gap, for example, surrounds the chip. Other gap arrangements, such as partially surrounding the chip, are also useful. Typically, a gap of about 0.005 to 0.010 inches is sufficient to allow underfill to fill the gap between the chip and carrier. The underfill preferably fills the cavity, protecting the conductive bumps as well as providing support for the chip.

The chip packages in accordance with the invention can be extended to or modified for multi-chip applications. For example, chips can be stacked on top of each other. Stacking of chips allows for increased device functions or capacity and without increasing package footprint. Other types of multi-chip applications can also be applicable. FIGS. 4-11 show multi-chip applications.

Figure 4:
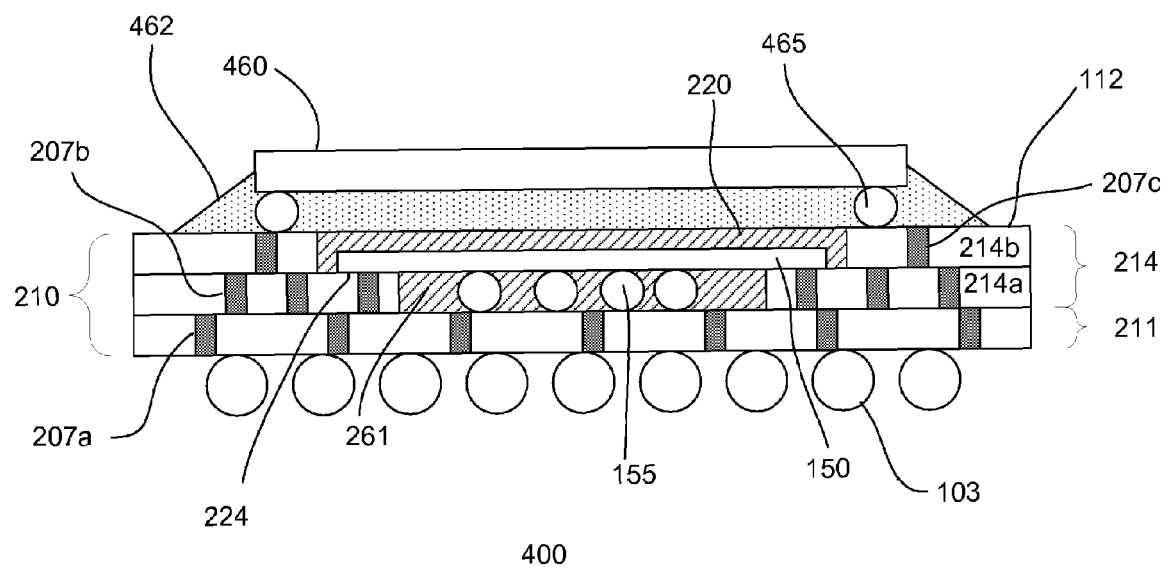
FIGS. 4-7 show various dual-stacked chip packages in accordance with various embodiments of the invention.

FIGS. 4-7 show dual-chip applications in accordance with the invention. Referring to FIG. 4, a chip package 400 which includes first and second chips 150 and 460. The package includes a carrier 210 with a cavity 220. The cavity is formed on a major surface 112. Opposite major surface 211 is provided with package contacts 103. Alternatively, the cavity and package contacts can be on the same major surface. The cavity comprises first and second sub-cavities formed by concentric or partially concentric openings. The first chip is mounted to the carrier in a similar manner as chip 150 of package 200 shown in FIGS. 2*a-b*. The carrier, for example, comprises a multi-layered laminate substrate that includes base and supplemental layers 211 and 214. In one embodiment, the supplemental layer includes a plurality of layers 214*a-b*, forming respective first and second sub-cavities. One or more of the base and supplemental layers can include multiple sub-layers.

In one embodiment, a second flip chip 460 is disposed over the cavity. Conductive bumps 465 of the second chip are bonded to conductive pads on the surface of the carrier. The second flip chip can be secured in place using, for example, adhesive conductive bumps and/or conductive tape. An underfill 462 is injected into the space between the chip and carrier (including the cavity). The underfill at least completely encases the solder bumps. Preferably, the underfill at least encases the solder bumps and a portion of the chip. To connect the chips to the package contacts, conductive traces can be provided on one or both surfaces of the layers of the carrier. Conductive traces on the different surfaces can be connected by, for example, blind, through or buried vias.

Figure 5:
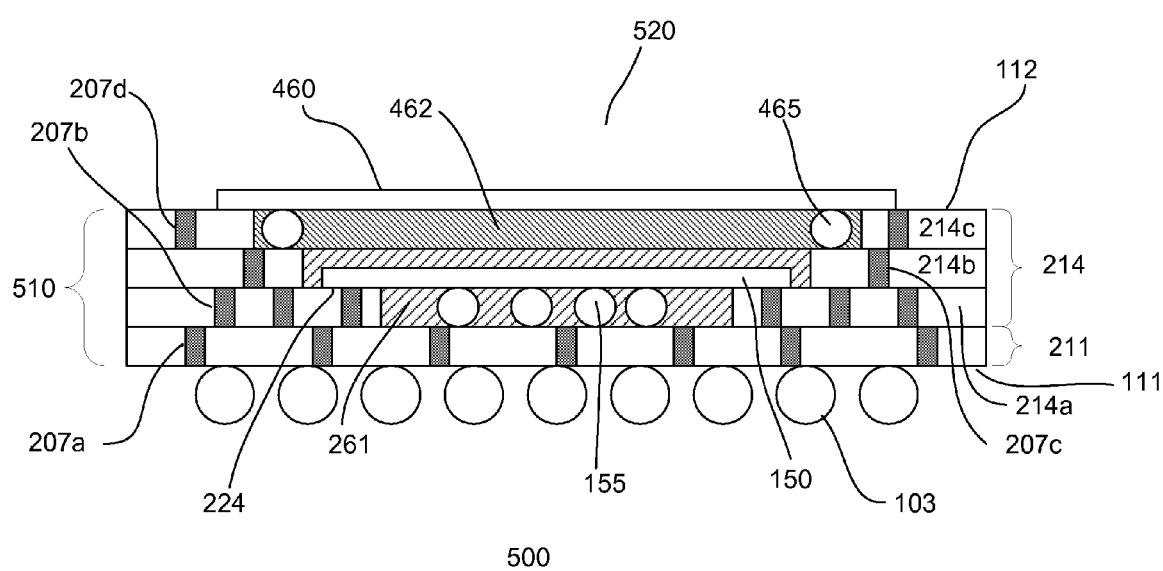

FIG. 5 shows another embodiment of a dual-chip package 500. As shown, the chip package includes a multi-layer laminate carrier 510 with a cavity 520 formed thereon. The cavity is formed on a major surface 112 which is opposite major surface 111 with package contacts 103. Alternatively, the cavity can be formed on the same major surface as the package contacts. The cavity comprises sub-cavities. In one embodiment, the cavity comprises first, second, and third sub-cavities. Providing a cavity with other numbers of sub-cavities is also useful. For example, the sub-cavities can be formed by concentric or partially concentric openings, arranged with the largest opening at the top of the cavity and decreasing to the smallest at the bottom of the cavity. The openings form a stepped sidewall profile which delineates the sub-cavities.

A plurality of chips are mounted in the cavity. In one embodiment, a plurality of flip chips are mounted in the cavity. As shown, the cavity includes first and second flip chips 150 and 460. The first flip chip is mounted to the cavity similarly as that of package 200 shown in FIGS. 2a-b. For example, the conductive or solder bumps of the first flip chip is connected to contact pads located on the base of the first sub-cavity while the chip is secured by tape or adhesive to the base of the second sub-cavity. An underfill 261 fills at least the space between the chip and the bottom of the cavity. In one embodiment, the underfill fills the first and second sub-cavities. The solder bumps of the second flip chip are connected to the contact pads located on the base of the third sub-cavity, with the chip securely attached to the surface of the carrier. An underfill 462 fills the third sub-cavity. The underfill can overfill the third sub-cavity, covering the edge or top of the second chip. Gaps are provided in the sub-cavities to enable the underfill to penetrate and encapsulate the conductive bumps of the chips.

The carrier, for example, comprises a multi-layered laminate substrate with base and supplemental layers 211 and 214. The supplemental layer includes a plurality of layers 214a-c, forming first, second and third sub-cavities. The base and/or supplemental layers can include multiple layers with or without electronic traces on one or both surfaces. Conductive traces on the different layers can be connected by, for example, blind, through or buried vias 207a-d.

As described, the bumps of the chips are bonded to alternative sub-cavities, such as the first and third sub-cavities. Other bonding arrangements are also useful. For example, the first chip can be encased in the first sub-cavity (top surface of the cap equal to or below the surface of the top of the first sub-cavity), similar to the configuration of package 300 of FIGS. 3a-b. As for the second chip, the conductive bumps 465 can be bonded to contact pads on the base of the third sub-cavity while the chip is securely attached to the major surface 112. The second chip can also be bonded and encased within the second sub-cavity, which may avoid the use of the third sub-cavity. The surface of the second chip can be below, at or above the surface of the carrier. Preferably, the chip is equal to or below the surface of the carrier.

Figure 6:
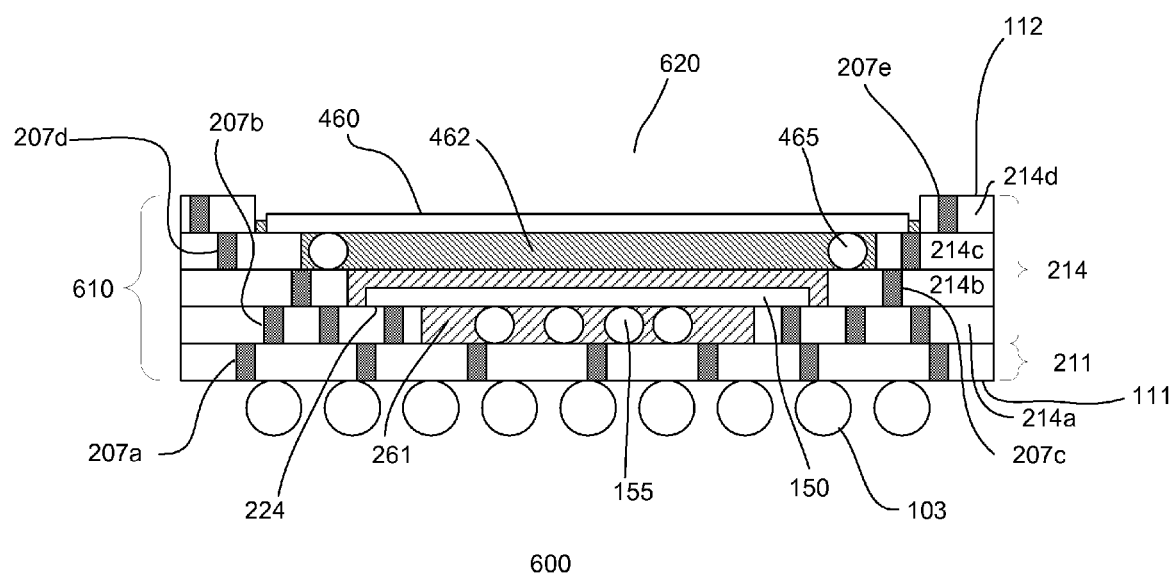

FIG. 6 shows yet another alternative embodiment of a dual-chip package 600. The package includes a carrier 610 with a cavity 620. The cavity is formed on a major surface 112. An opposite major surface 111 of the carrier includes package contacts 103. Alternatively, the cavity and package contacts can be on the same major surface. The cavity is similar to cavity 520 in FIG. 5 except that it includes an additional fourth sub-cavity. The additional sub-cavity can be formed by including an additional supplemental layer 214d in the supplemental layer stack 214.

First and second flip chips 150 and 460 are mounted in the sub-cavities. The conductive bumps of the first flip chip are connected to the contact pads on the bottom of the first sub-cavity with the chip securely held in place with adhesive or tape on the base of the second cavity. The conductive bumps of the second flip chip are connected to the contact pads on the base of the third sub-cavity with the chip securely held in place with adhesive or tape on the base of the fourth sub-cavity. Conductive traces can be formed on one or both surfaces of one, some or all of the carrier layers for connecting the chips to the package contacts. Blind, buried or through vias 207a-e can be provided to interconnect traces on different layers.

Attaching the chip directly to the surface of the sub-cavity securely holds it in place during assembly, improving yield and reliability. The height of the fourth sub-cavity should be equal to or greater than the thickness of the chip. This enables the cavity to encase the second flip chip. Providing a fourth sub-cavity having a height which is less than the thickness of the chip is also useful.

Figure 7:
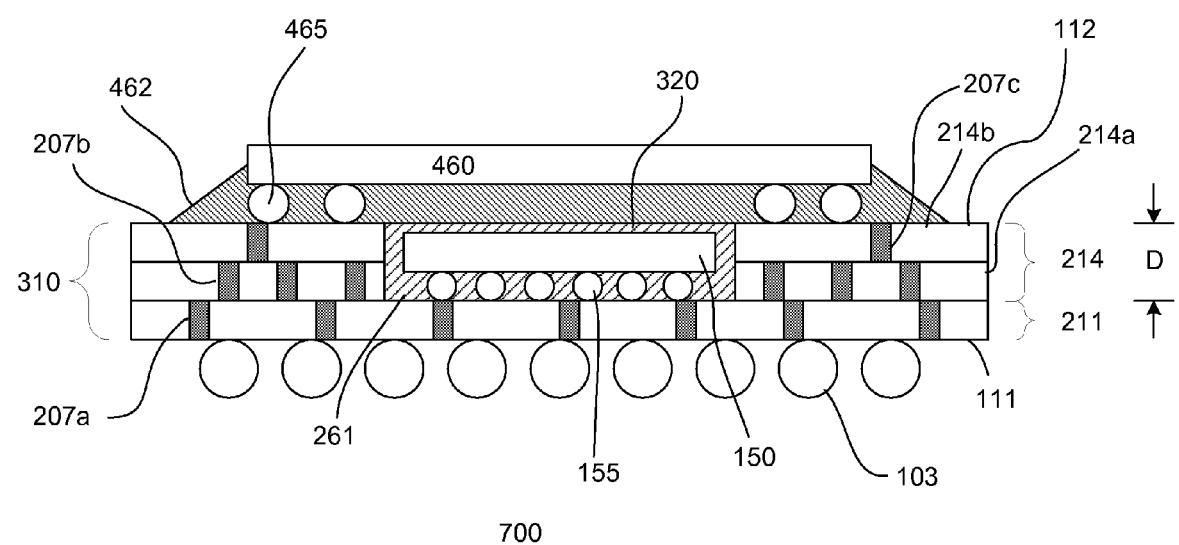

FIG. 7 shows a dual-chip package 700 in accordance with another embodiment of the invention. The package includes a cavity 320 formed on a major surface 112 of a carrier 310. Package contacts 103 are provided on opposite major surface 111. In other embodiments, the cavity and package contacts can be on the same major surface. The cavity comprises continuous sidewalls from the top to the bottom of the cavity which preferably are vertical or substantially vertical. A first flip chip 150 is placed in the cavity and connected to contact pads on the carrier. The depth D of the cavity is greater than or equal to the height of the chip in the cavity.

A second flip chip 460 is connected to the package over the cavity. The conductive bumps of the flip chip are mated to contacts located on the surface of the carrier around the periphery of the cavity. To protect the solder bumps, an underfill 462 is injected into the space between the second chip and the carrier (including the cavity). Conductive traces can be formed on surface(s) of the various layers and interconnected by vias to provide electrical connection between the chips and the package contacts.

Figure 8:
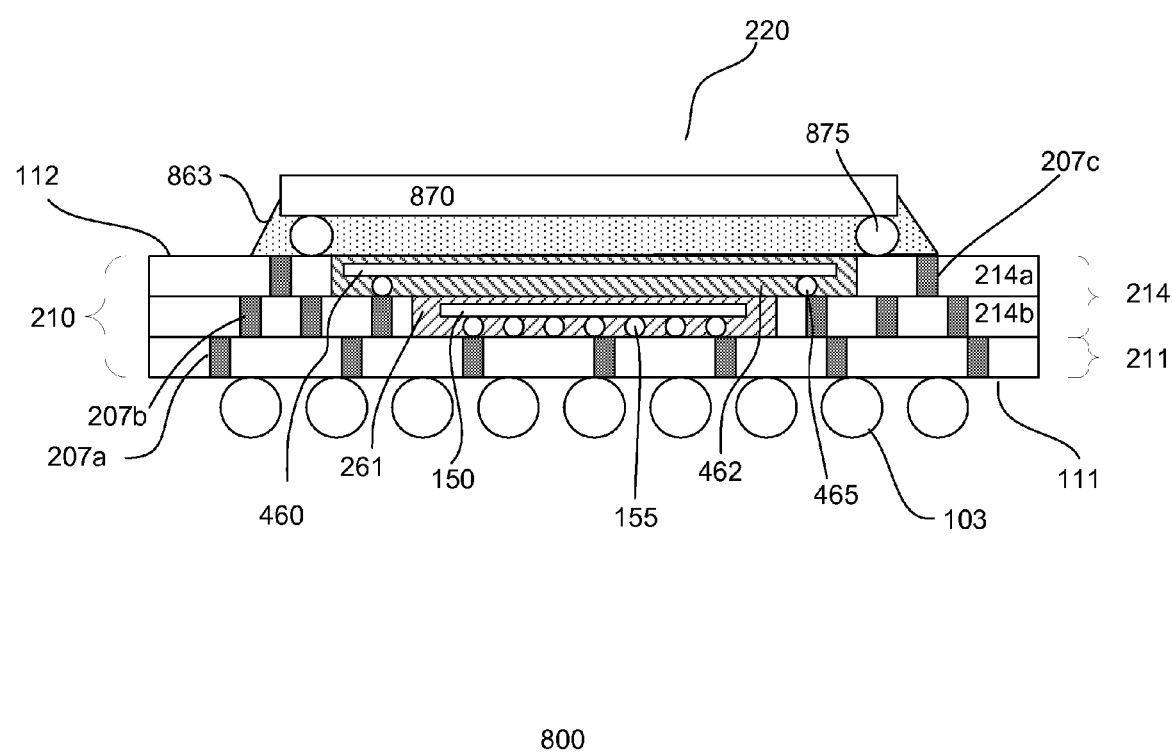
FIGS. 8-9 show various tri-stacked chip packages in accordance with various embodiments of the invention.
Figure 9:
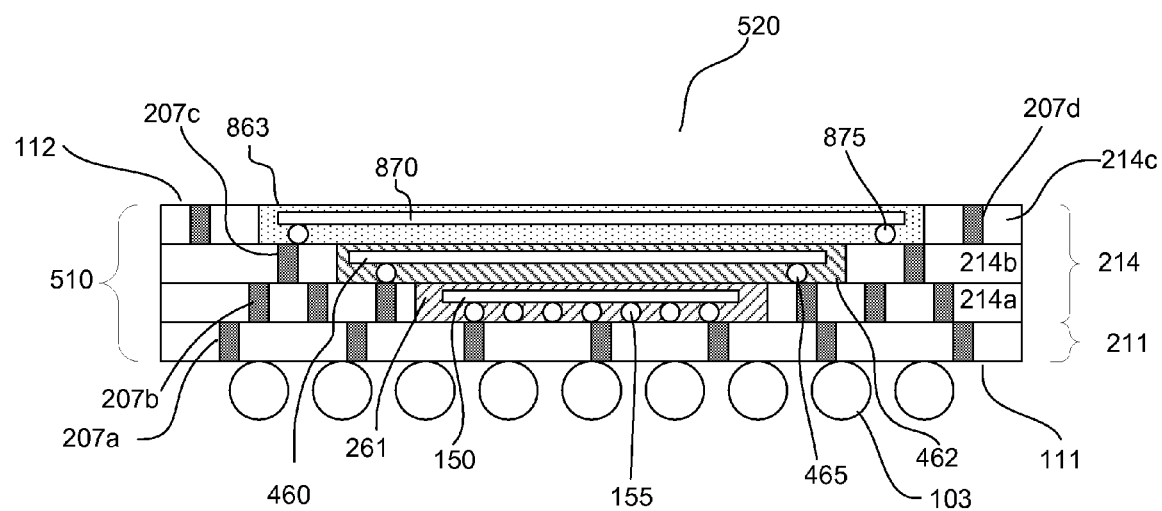

Tri-chip packages in accordance with various embodiments of the invention are shown in FIGS. 8-9. Referring to FIG. 8, a package 800 includes carrier 210. The carrier includes a cavity 220 with first and second sub-cavities formed on a surface 112. As shown, the cavity is formed on an opposite surface 111 with package contacts 103. Forming the cavity on the same surface as the package contacts is also useful. First and second chips 150 and 460 are attached to the carrier. In one embodiment, the first chip is mounted in the first sub-cavity and encased therein, similar to the configuration of package 300 of FIGS. 3a-b. The second chip is bonded to and encased within the second sub-cavity. For example, conductive bumps 465 are bonded to contact pads on the base of the second sub-cavity. Underfills 261 and 462 are provided for the first and second chips to protect the conductive bumps as well as to serve as a support for the chips in the package after assembly.

In one embodiment, a third chip 870 is mounted onto the carrier in a similar manner as chip 460 in FIG. 4. For example, the third chip is disposed over the cavity, with conductive bumps 875 bonded to conductive pads on the surface of the carrier. The third chip can be secured in place using, for example, adhesive conductive bumps and/or conductive tape. An underfill 863 is injected into the space between the chip and the carrier 210.

The carrier, for example, comprises a multi-layered laminate substrate with base and supplemental layers 211 and 214a-b. The supplemental layers form respective first and second sub-cavities. To connect the chips to the package contacts, conductive traces can be provided on one or both surfaces of the layers of the carrier. Blind, through or buried vias are used to connect conductive traces on the different surfaces as desired.

As shown in FIG. 9, another tri-chip package 900 includes a carrier 510 on which first, second and third chips 150, 460 and 870 are attached. The carrier includes a cavity 520 with first, second and third sub-cavities formed on a surface 112. Package contacts 103 are formed on a surface 111. As such, the cavity and package contacts are disposed on opposite surfaces. The cavity and package contacts can alternatively be formed on the same surface. First and second chips 150 and 460 are attached to the carrier in a similar manner as those of package 800 in FIG. 8. The third chip is bonded to and encased within the third sub-cavity, like the first and second chips in their respective sub-cavities. Underfills 261, 462 and 863 are provided for the chips to protect the conductive bumps as well as to support the chips in the package after assembly.

A multi-layered laminate substrate can be used to form the carrier. The substrate includes a base 211 and supplemental layers 214a-c corresponding to the sub-cavities. Conductive traces can be provided on one or both surfaces of the layers of the carrier to connect the chips to the package contacts. Blind, through or buried vias are used to connect conductive traces on the different surfaces as desired.

Figure 10:
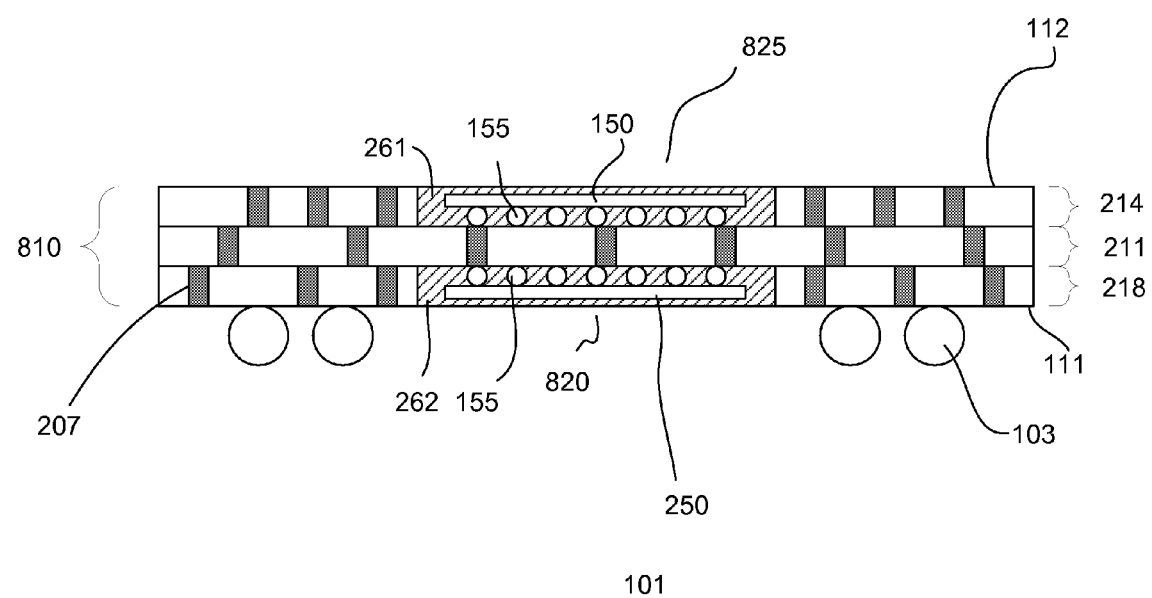
FIGS. 10-11 show various dual-cavity stacked chip packages in accordance with various embodiments of the invention.
Figure 11:
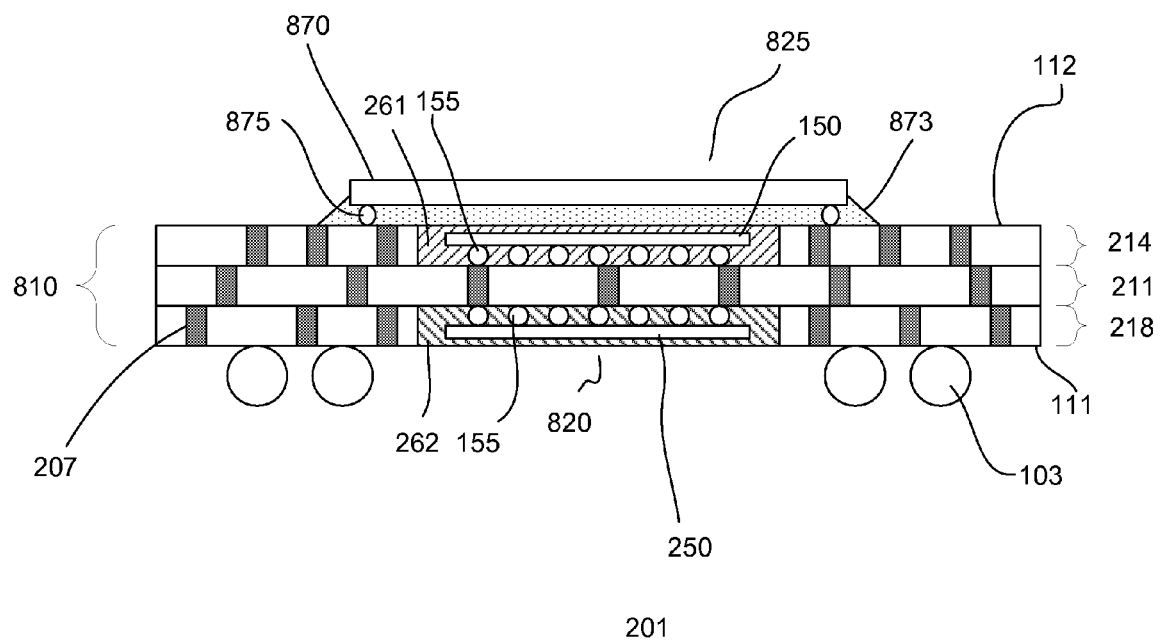

FIGS. 10-11 show cavity chip packages in accordance with other embodiments of the invention. Referring to FIG. 10, a package 101 includes carrier 810 with cavities 820 and 825 formed on opposite surfaces 111 and 112. Package contacts are disposed on surface 111. As shown, the cavities comprise continuous sidewalls from top to bottom. Preferably, the sidewalls are vertical or substantially vertical. The dimensions of the cavities should be sufficient to accommodate the IC chips and can be selected accordingly depending on the application. For example, the package can be designed for a specific type of IC or for different ICs. It is understood that the dimensions of the cavities need not be the same. Typically, the cavities comprise a rectangular shape or a shape which corresponds to the shape of the chips. Other shapes can also be useful.

In one embodiment, the carrier comprises a multi-layered laminate substrate with base and supplemental layers 211, 214 and 218. The base layer serves as a substrate on which the chips are attached while the supplemental layers form the first and second cavities. The base and supplemental layers can be bonded together to form the carrier. Contact pads are disposed on both surfaces of the base layer in the cavity regions for electrical coupling with the chips. Conductive traces fan out from the contact pads and are coupled to the package contacts. A solder mask comprising an insulating material can be provided on the carrier surfaces, covering the electrical traces and openings corresponding to the package contacts and contact pads. In one embodiment, the base and supplemental layers can include multiple layers or sub-layers, with or without conductive traces on its surfaces. Adjacent electronic traces are isolated by an insulating layer. The conductive traces on the different layers (or sub-layers) can be interconnected as desired using blind, buried or through vias 207.

First and second chips 150 and 250 are disposed in the first and second cavities of the carrier. The chips can be attached to the cavities in a similar configuration as chip 150 of package 900 in FIG. 9. For example, the chips are bonded and encased within the cavities. The depth of the cavities should be equal to or greater than the total thickness of the chips. Other cavity depths are also useful. For example, the depth of a cavity may be less than the thickness of the chip to be attached therein. For the cavity on the same surface as the package contacts, sufficient space should be allocated for mounting the package, for example, on a printed circuit board (PCB). Underfills 261 and 262 are provided for the first and second chips to protect the conductive bumps as well as to serve as a support for the chips in the package after assembly. In one embodiment, the underfills fill the cavities.

Referring to FIG. 11, a package 201 includes carrier 810 with cavities 820 and 825 formed on opposite surfaces 111 and 112. First and second chips 150 and 250 are mounted to the carrier. The carrier and mounting of the first and second chips are similar to those of package 101 of FIG. 10. A third chip 870 is attached to the carrier. In one embodiment, the third chip is attached to the surface of the carrier without the package contacts 103. The third chip is disposed over the cavity, with its conductive bumps 875 bonded to conductive pads on the surface of the carrier surrounding the cavity. The second flip chip can be secured in place using, for example, adhesive conductive bumps and/or conductive tape. An underfill 873 is injected into the space between the chip and carrier.

The cavities of packages 101 and 201, as shown, have continuous sidewalls in which chips are bonded and encased therein. The packages can be modified by providing carriers wherein one or both cavities include sub-cavities. Further, the chips can be attached in accordance with various configurations, including stacking two or more chips in one or both cavities of a carrier. For example, conductive bumps can be bonded to the base of one sub-cavity while the chip is attached to the base of the sub-cavity above. The surface of the chip can be below, equal to or above the top of the sub-cavity above. In other embodiments, a plurality of cavities can be provided on one or both surfaces of the carrier. Providing one cavity on one major surface and a plurality of cavities on the other major surface is also useful. For such applications, the package contacts are preferably mounted on the surface with one cavity.

Figure 12:
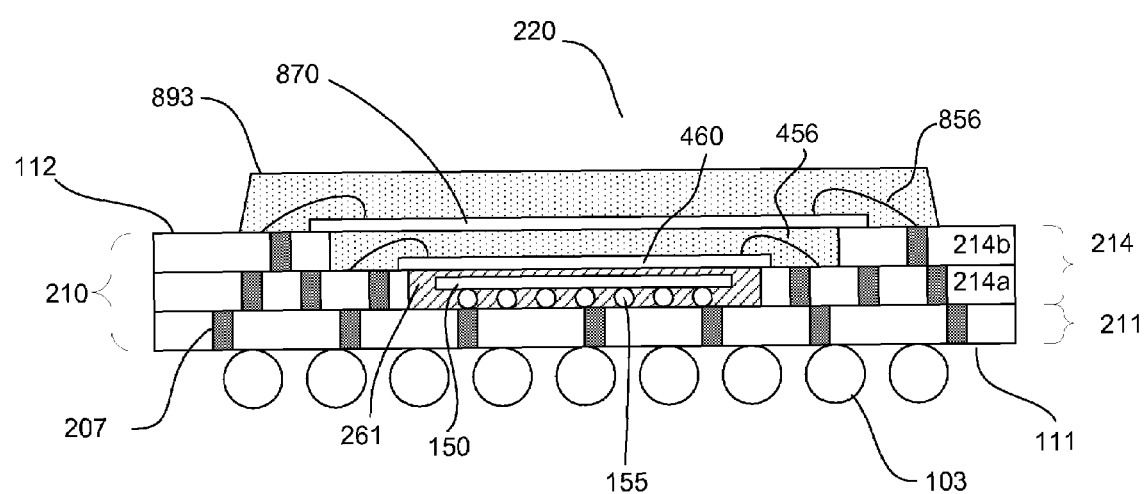
FIGS. 12-15 show various embodiments of the invention.

The various packages described, including the dual-cavity packages, can be used with flip chips, wire bonded chips, or a combination thereof. For example, a package 301 depicted in FIG. 12 includes a carrier 210 with a cavity 220. The package includes elements similar to those of other packages already described and are designated with the same reference numbers. First, second and third chips (150, 460 and 870) are bonded to the carrier. As shown, the first chip is a flip chip while the second and third chips are wire bonded chips. The flip chip is bonded to and encased within the first sub-cavity; the second and third chips are wired bonded to the base of the second sub-cavity and surface of the carrier, respectively. Providing other combinations of chip types as well as cavity or mounting configurations is also useful.

A cap 893 which covers the chip is provided. The cap at least covers the chip and the wire bonds, protecting them from breaking and the external environment. Encapsulants, such as epoxy molding compound, sealing resin or the like can be used to form the cap. Alternatively, encapsulants with high thermal conductivity can be used to form the cap. This can be achieved by introducing additional fillers which contain ceramic or metallic particles into the molding compound as described in, for example, U.S. Pat. Nos. 6,469,086 and 5,681,883. The encapsulant, for example, also fills the second sub-cavity.

Figure 13:
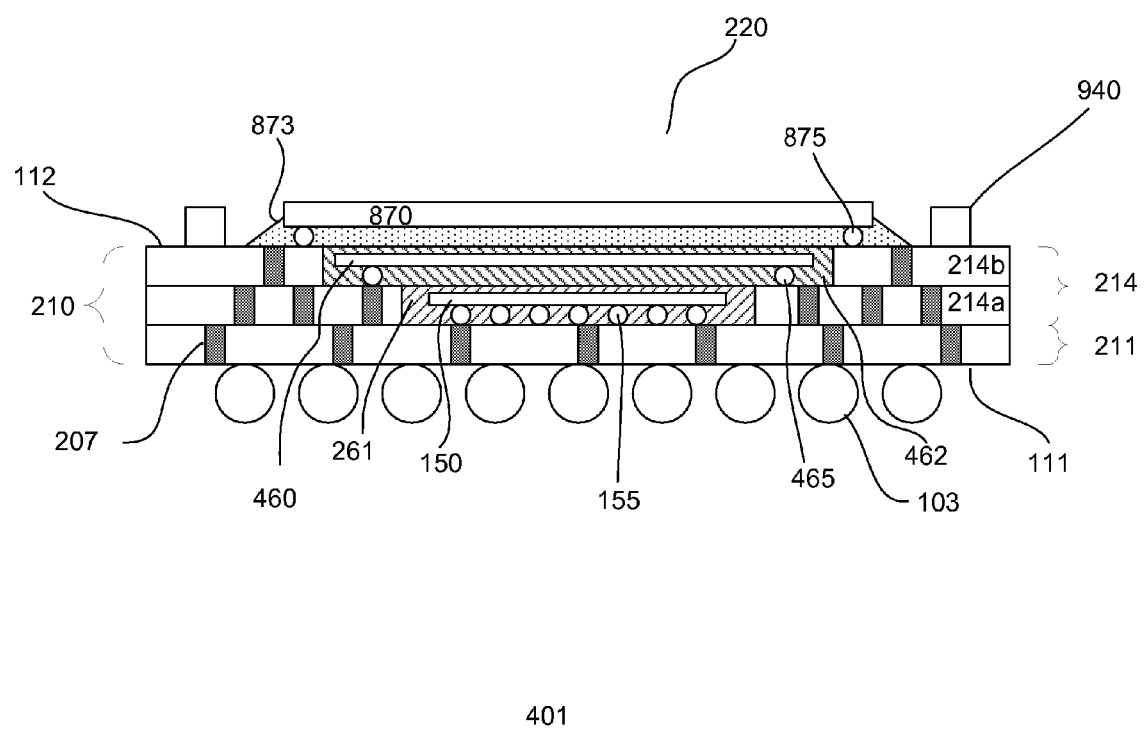
Figure 14:
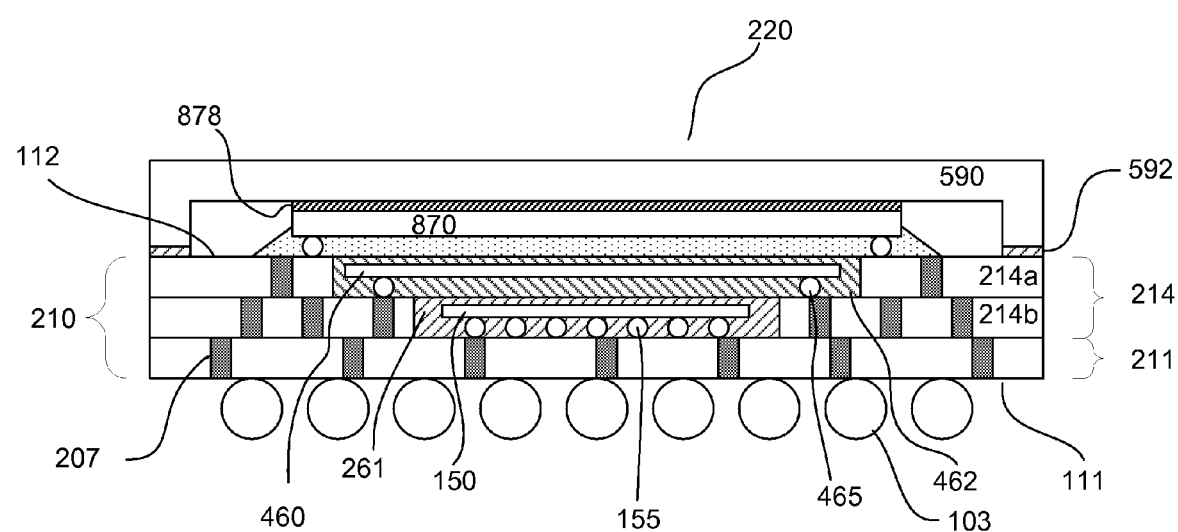
Figure 15:
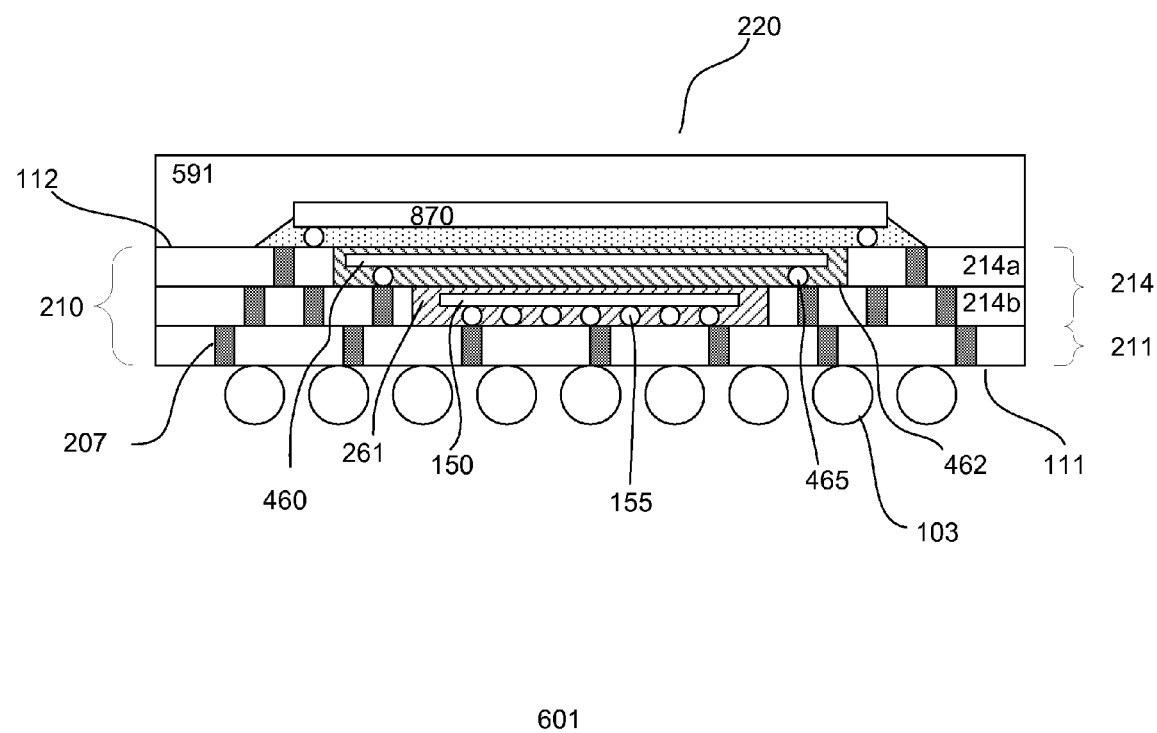

FIGS. 13-15 show packages in accordance with the invention which include different features for specific applications. Referring to FIG. 13, a package 401 includes a carrier 210 having a cavity 220. First, second and third chips (150, 460 and 870) are bonded to the carrier in or above the cavity. In one embodiment, passive components 940 are attached to the carrier surface. The passive components serve to improve electrical performance of the packaged device. Various types of passive components can be attached. For example, the passive components can include capacitors, resistors or a combination thereof.

Referring to FIG. 14, a package 501 includes a carrier 210 having a cavity 220 in which first, second and third chips 150, 460 and 870 are bonded. In one embodiment, a heat sink 590 is provided to dissipate heat generated by the packaged device. Typically, the heat sink comprises a heat conductive material, for example copper or other metallic materials. The heat sink, in one embodiment, is mounted on the carrier surface and forms a cap. An adhesive 592, such as epoxy or thermal grease, can be used to attach the cap to the carrier surface. Other techniques can also be used to attach the heat sink to the carrier surface. The top surface of the chip should be above the carrier surface to facilitate contact with the heat sink. A thermal interface material 878, such as thermal grease, is disposed between the surface of the chip and heat sink, The use of a heat sink improves thermal conduction, which increases reliability by keeping the packaged device within the recommended operating temperature range.

In FIG. 15, a package 601 is shown. The package includes first, second and third chips (150, 460 and 870) attached in or above a cavity 220 formed on a surface 112 of a carrier 210. A cap 591 is formed over the surface of the carrier. The cap encapsulates the top surface of the substrate and the chip to protect the chip from the external environment. The cap can be formed from, for example, an encapsulant such as epoxy molding compound. Other types of encapsulants are also useful.

Although the passive component, heat sink, and cap have been described in the context of a specific package type, it is understood that these features can be applicable to the various other packages described herein. Furthermore, these components can be used alone or in any combination as desired, depending on the applications. For example, passive components and a heat sink can be provided in a package to improve thermal and electrical performance.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A chip package for attaching a semiconductor die having an active surface, the active surface having a bump region with die conductive bumps thereon and a peripheral region without die conductive bumps, the chip package comprising:
    a carrier substrate having first and second major surfaces;
    a cavity formed on the first major surface of the carrier substrate, the cavity having a height $H_1$ and a cavity bottom surface with contacts pads disposed thereon, wherein the height $H_1$ is selected such that when the semiconductor die is attached, the die conductive bumps are coupled to the contact pads in the cavity and at least portions of the peripheral region of the active surface are mounted to a top surface of the cavity; and
    package contacts disposed on one of the first or second major surfaces, wherein the contact pads are electrically coupled to the package contacts.

2. The chip package of claim 1 further comprises underfill material in the cavity, the underfill material at least fills the space between the semiconductor die and the cavity bottom surface.

3. The chip package of claim 1 wherein the package comprises a semiconductor die attached to the carrier, the semiconductor die comprises a flip chip.

4. The chip package of claim 3 further comprises underfill material in the cavity, the underfill material at least fills the space between the semiconductor die and the cavity bottom surface.

5. The chip package of claim 1 wherein the cavity comprises first and second sub-cavities, the first sub-cavity comprises the cavity bottom surface with the height $H_1$ and the second sub-cavity is larger than the first sub-cavity, wherein when the semiconductor die is attached, the die conductive bumps are coupled to the contact pads and at least portions of the peripheral region of the active surface are mounted on a top surface of the first sub-cavity.

6. The chip package of claim 5 wherein the carrier substrate comprises base and supplemental layers, the base layer serves as the cavity bottom surface of the first sub-cavity and the supplemental layers form sidewalls of the first and second sub-cavities.

7. The chip package of claim 5 wherein the second sub-cavity comprises a second sub-cavity height $H_2$, wherein $H_2$ is at least equal to or greater than a thickness of the semiconductor die.

8. The chip package of claim 7 wherein the carrier substrate comprises base and supplemental layers, the base layer serves as the cavity bottom surface of the first sub-cavity and the supplemental layers form sidewalls of the first and second sub-cavities.

9. The chip package of claim 1 wherein
    the cavity comprises a plurality of sub-cavities, wherein n and n-1 sub-cavities of the plurality of sub-cavities are arranged such that the n sub-cavity is above and larger than the n-1 sub-cavity, the n-1 sub-cavity comprises the height $H_1$ and contact pads at n-1 cavity bottom surface, wherein when the semiconductor die is attached, the die conductive bumps are coupled to the contact pads in the n-1 cavity bottom surface and at least portions of the peripheral region of the active surface are mounted on n-1 cavity top surface.

10. The chip package of claim 9 wherein the carrier substrate comprises base and supplemental layers, the base layer serves as the cavity bottom surface of the first of the plurality of sub-cavities and the supplemental layers form sidewalls of other of the plurality of sub-cavities.

11. The chip package of claim 9 wherein the n sub-cavity comprises a n sub-cavity height $H_n$, wherein $H_n$ is at least equal to or greater than a thickness of the semiconductor die.

12. The chip package of claim 11 wherein the carrier substrate comprises base and supplemental layers, the base layer serves as the cavity bottom surface of the first of the plurality of sub-cavities and the supplemental layers form sidewalls of the other of the plurality of sub-cavities.

13. A chip package for attaching a semiconductor die having an active surface, the active surface having a bump region with die conductive bumps thereon and a peripheral region without die conductive bumps, the chip package comprising:
- a carrier substrate having first and second major surfaces;
- a cavity formed on the first major surface of the carrier substrate, the cavity comprising a plurality of sub-cavities formed by a plurality of at least partially concentric openings, wherein n and n-1 sub-cavities of the plurality of sub-cavities are arranged such that the n sub-cavity is above and larger than the n-1 sub-cavity, the n-1 sub-cavity comprises the height $H_1$ and contact pads at n-1 cavity bottom surface, wherein when the semiconductor die is attached, the die conductive bumps are coupled to the contact pads and at least portions of the peripheral region of the active surface are mounted on at least portions of a top surface of n-1 sub-cavity; and
- package contacts disposed on one of the major surfaces, wherein the contact pads are electrically coupled to the package contacts.

14. The chip package of claim 13 wherein the n sub-cavity comprises a n sub-cavity height $H_n$, wherein $H_n$ is at least greater than a thickness of the semiconductor die.

15. The chip package of claim 13 wherein the carrier substrate comprises base and supplemental layers, the base layer serves as the cavity bottom surface of the first of the plurality of sub-cavities and the supplemental layers form sidewalls of the other of the plurality of sub-cavities.

16. A method of chip packaging comprising:
- providing a carrier having a cavity formed on a first major surface thereof the cavity including a cavity bottom surface having package pads and a height $H_1$;
- providing a semiconductor die with an active surface having a bump region with die conductive bumps thereon and a peripheral region without die conductive bumps; and
- attaching a semiconductor die to the carrier, wherein the height $H_1$ is selected such that conductive bumps are mated to contact pads and at least portions of the peripheral region of the active surface are securely attached to at a top surface of the cavity by an adhesive material.

17. The method of claim 16 further comprises providing an underfill material in the cavity, the underfill material at least fills the space between the semiconductor die and the cavity bottom surface.

18. The method of claim 16 wherein providing a semiconductor die comprises providing a flip chip.

19. The method of claim 18 further comprises providing an underfill material in the cavity, the underfill material at least fills the space between the semiconductor die and the cavity bottom surface.

20. The method of claim 16 wherein:
- the cavity comprises first and second sub-cavities, the first sub-cavity comprises the cavity bottom surface with the height $H_1$ and the second sub-cavity is larger than the first sub-cavity; and
- $H_1$ is selected such that the die conductive bumps are mated to the contact pads and at least portions of the peripheral region of the active surface are securely attached to a top surface of the first sub-cavity.

21. The method of 20 wherein the second sub-cavity comprises a second sub-cavity height $H_2$, wherein $H_2$ is at least equal to or greater than a thickness of the semiconductor die.

22. The method of claim 16 wherein:
- the cavity comprises a plurality of sub-cavities, wherein n and n-1 sub-cavities of the plurality of sub-cavities are arranged such that the n sub-cavity is above and larger than the n-1 sub-cavity, the n-1 sub-cavity comprises the height $H_1$ and contact pads at n-1 cavity bottom surface; and
- $H_1$ is selected such that the die conductive bumps are mated to the contact pads and at least portions of the peripheral region of the active surface are securely attached to a top surface of the n-1 sub-cavity.

23. The method of 22 wherein then sub-cavity comprises an sub-cavity height $H_n$, wherein $H_n$ is at least equal to or greater than a thickness of the semiconductor die.

* * * * *